(12) United States Patent
Chitnis

(10) Patent No.: US 7,982,363 B2
(45) Date of Patent: Jul. 19, 2011

(54) BULK ACOUSTIC DEVICE AND METHOD FOR FABRICATING

(75) Inventor: Ashay Chitnis, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/803,449

(22) Filed: May 14, 2007

(65) Prior Publication Data

US 2008/0284541 A1 Nov. 20, 2008

(51) Int. Cl.
*H03H 9/125* (2006.01)
(52) U.S. Cl. ............ 310/313 R; 310/320; 310/365
(58) Field of Classification Search .......... 310/313, 310/320, 365
See application file for complete search history.

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| 5,210,051 A | 5/1993 | Carter, Jr. et al. | 437/107 |
| RE34,861 E | 2/1995 | Davis et al. | 437/100 |
| 5,393,993 A | 2/1995 | Edmond et al. | 257/77 |
| 5,523,589 A | 6/1996 | Edmond et al. | 257/77 |
| 5,592,501 A | 1/1997 | Edmond et al. | 372/45 |
| 6,218,680 B1 | 4/2001 | Carter, Jr. et al. | 257/77 |
| 6,924,583 B2 * | 8/2005 | Lin et al. | 310/324 |
| 7,112,860 B2 | 9/2006 | Saxler | 257/416 |
| 2005/0093396 A1 * | 5/2005 | Larson et al. | 310/320 |
| 2005/0184627 A1 | 8/2005 | Sano et al. | |
| 2005/0248232 A1 * | 11/2005 | Itaya et al. | 310/320 |
| 2005/0255234 A1 * | 11/2005 | Kanda et al. | 427/100 |
| 2005/0287774 A1 * | 12/2005 | Shibata et al. | 438/502 |
| 2006/0037183 A1 | 2/2006 | Iwashita et al. | |
| 2006/0145785 A1 | 7/2006 | Ishii et al. | |
| 2007/0040281 A1 * | 2/2007 | Nakayama et al. | 257/778 |

OTHER PUBLICATIONS

Petroni et al., "GaN-Based Surface Acoustic Wave Filters for Wireless Communications", Superlattices and Microstructures, 36 (2004), pp. 825-831.
Palacios et al., "Remote Collection and Measurement of Photogenerated Carriers Swept by Surface Acoustic Waves in GaN", Applied Physics Letters, Vo. 84, No. 16, 3162-3168. Apr. 19, 2004.
Dubois, "Thin Film Bulk Acoustic Wave Resonators: A Technology Overview", Memswave 03, Toulouse France, Jul. 2-4, 2003.
Official Search Report Prom European Patent Office, Dated: Sep. 25, 2008, European Patent Application No. 08251672.5.

* cited by examiner

*Primary Examiner* — Walter Benson
*Assistant Examiner* — Bryan P Gordon
(74) *Attorney, Agent, or Firm* — Koppel, Patrick, Heybl & Philpott

(57) ABSTRACT

A method for fabricating a bulk acoustic wave (BAW) device comprising providing a growth substrate and growing an Group-III nitride epitaxial layer on the growth substrate. A first electrode is deposited on the epitaxial layer. A carrier substrate is provided and the growth substrate, epitaxial layer and first electrode combination is flip-chip mounted on the carrier substrate. The growth substrate is removed and a second electrode is deposited on the epitaxial layer with the epitaxial layer sandwiched between the first and second electrodes. A bulk acoustic wave (BAW) device comprises first and second metal electrodes and a Group-III nitride epitaxial layer sandwiched between the first and second electrodes. A carrier substrate is included, with the first and second electrodes and epitaxial layer on the carrier substrate.

39 Claims, 4 Drawing Sheets

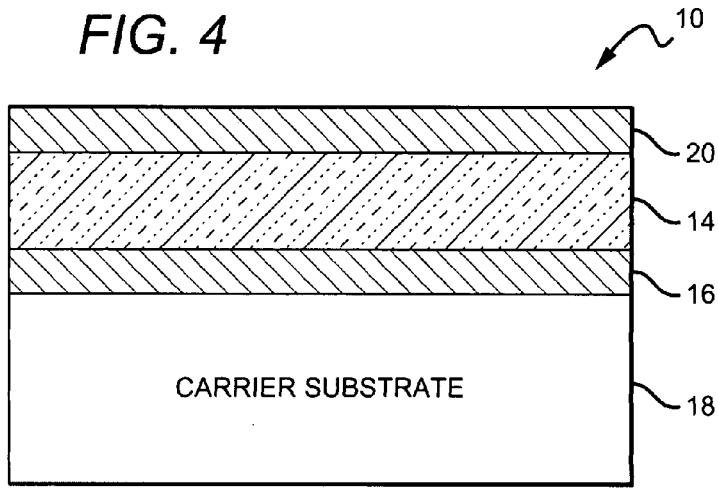
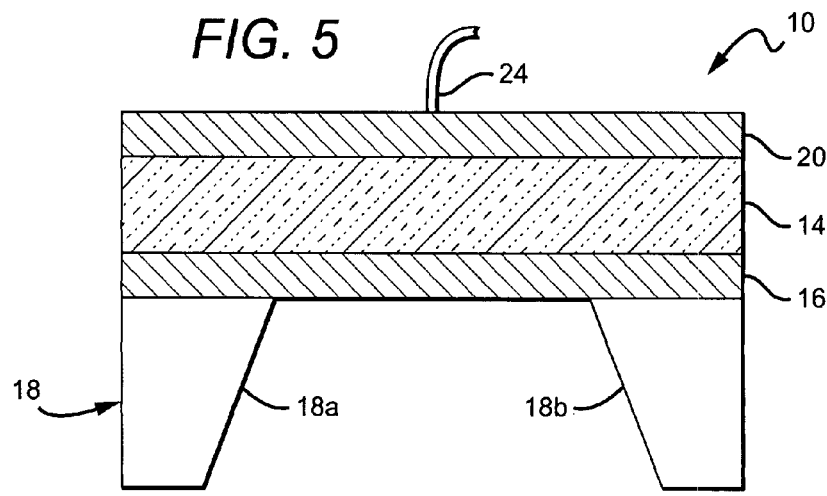
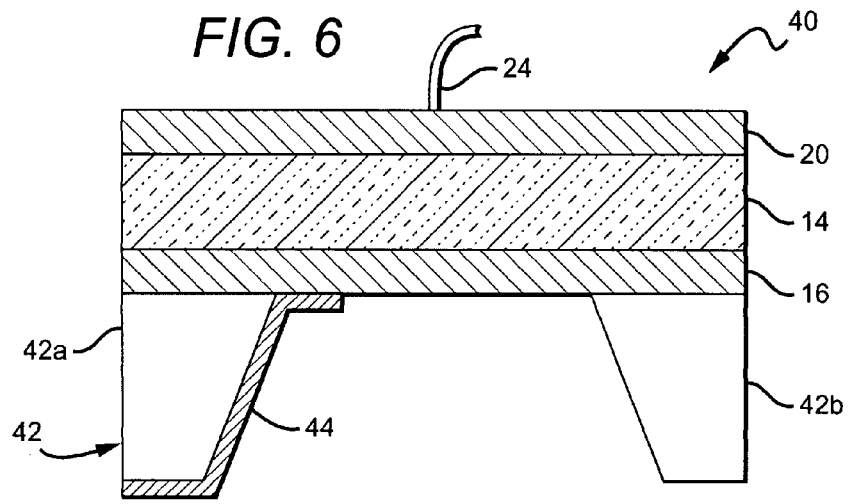

BULK ACOUSTIC DEVICE AND METHOD FOR FABRICATING

BACKGROUND OF THE INVENTION

1. Field of the Invention

This invention relates to acoustic wave devices and more particularly to Group-III nitride based bulk acoustic devices and methods for fabricating the devices.

2. Description of the Related Art

Acoustic wave is a form of disturbance involving material deformation. Deformation occurs when motion of individual atoms are such that the distances between the atoms changes, accompanied by internal forces to restore the distance. If the deformation is time-variant, then these internal forces and effects determine motion of each atom. This gives rise to a wave motion with each atom oscillating about its equilibrium position. The material is then called "elastic" and the waves generated are called "elastic waves" or "acoustic waves". There are two types of acoustic waves: longitudinal and shear waves based on the vibration and propagation direction of atoms and the wave respectively. One type is known as surface acoustic wave "SAW" that propagates along a plane surface of a homogeneous medium. Another type is referred to as bulk acoustic waves that propagate through a medium.

In electronic applications this phenomenon has been used to develop acoustic sensors/transducers, resonators, filters, etc. For frequencies below 50 MHz propagation medium can typically comprise quartz or glass. At higher frequencies crystalline media such as sapphire ($Al_2O_3$), zinc-oxide (ZnO) and lithium niobate are used. Such devices can operate at up to 5 GHz. These material systems make use of a phenomenon called "piezoelectricity". Piezoelectricity in many materials couples elastic stresses and strains to electric field and displacements. It typically only occurs in anisotropic medium whose material structure lacks center of symmetry. Typical materials include ZnO, Lithium Niobate, and Group-III nitrides.

Surface acoustic wave (SAW) devices typically propagate onto the base of the piezoelectric material. SAW devices are used in high frequency components in modern communication systems due to their stability, reliability and compactness. SAW devices typically comprise a piezoelectric film on which two interdigitated transducers (IDT) are deposited so that high frequency AC electric fields can be converted into acoustic waves and vice versa. In a typical SAW device an input signal at the first IDT is transformed to an elastic perturbation that propagates along the surface of the piezoelectric film towards the output IDT. When voltage is applied at the input IDT an electric field is set up in each inter-electrode gap and surface waves are generated with amplitudes proportional to the voltage difference between the adjacent electrodes. These generated waves are received at the output IDT and an electrical signal is generated at the output IDT corresponding to the acoustic perturbation.

Recently there has been interest in developing Group-III nitride acoustic devices mainly due to superior electronic and acoustic properties. Group-III nitrides have piezoelectric properties and Group-III nitride acoustic devices have been developed, but mainly limited to SAW devices [Petroni et al., *GaN Based Surface Acoustic Wave Filters for Wireless Communications*, Superlattices and Microstructures, 36 (2004), 825-831; Palacios et al., *Remote Collection and Measurement of Photogenerated Carriers Swept by Surface Acoustic Waves in GaN*, Applied Physics Letters, Vol. 84, No. 16, 3162-3168]. These technologies, however, have several limitations including but not limited to limited power handling capability due to power density stored close to the propagation surface, increased sensitivity to surface contamination, and device dimensions (and frequency of operation) limited by current lithography techniques such as the space between IDTs. It is difficult for current lithography techniques space small enough between IDTs for higher frequency devices.

Bulk acoustic wave (BAW) devices are associated with waves traveling through a solid medium. Based on the choice of medium, attenuation can be low i.e. inherent propagation losses can be minimized. In addition, higher velocities can be achieved as well as higher frequencies when using thin film medium. Power handling can also be increased using BAW devices.

BAW devices have been developed using polycrystalline AlN as the active medium [Dubois, *Thin Film Bulk Acoustic Wave Resonators: A Technology Overview*, Memswave 03, Toulouse France, Jul. 2-4, 2003]. One significant disadvantage of this approach is the high propagation loss due to the polycrystalline nature of AlN films.

SUMMARY OF THE INVENTION

One embodiment of a method for fabricating a bulk acoustic wave (BAW) device according to the present invention provides a growth substrate and growing an epitaxial layer on the growth substrate. A first electrode is deposited on the epitaxial layer. A carrier substrate is provided and the growth substrate, epitaxial layer and first electrode combination is flip-chip mounted on the carrier substrate. The growth substrate is removed and a second electrode is deposited on the epitaxial layer with the epitaxial layer sandwiched between the first and second electrodes.

One embodiment of a bulk acoustic wave (BAW) device according to the present invention comprises first and second metal electrodes and a Group-III nitride epitaxial layer sandwiched between the first and second electrodes. A carrier substrate is included with the first and second electrodes and epitaxial layer on the carrier substrate.

These and other aspects and advantages of the invention will become apparent from the following detailed description and the accompanying drawings which illustrate by way of example the features of the invention.

BRIEF DESCRIPTION OF THE DRAWINGS

FIG. 4 is a sectional view of the BAW device in FIG. 3 with a second electrode;

FIG. 5 is a sectional view of the BAW device in FIG. 4 after backside processing;

FIG. 6 is another embodiment of a BAW device according to the present invention after backside processing;

DETAILED DESCRIPTION OF THE INVENTION

Figure 1:
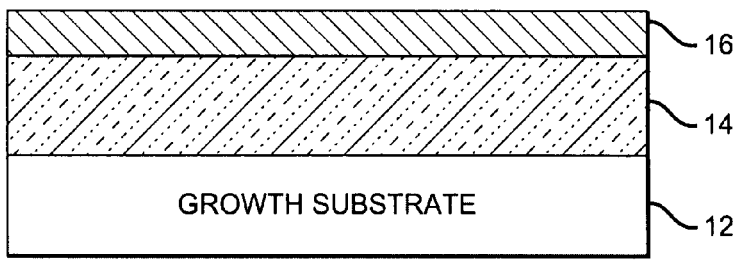
FIG. 1 is sectional view of one embodiment of a BAW device according to the present invention at fabrication step having an epitaxial layer and first electrode on a growth substrate.

The present invention generally relates to bulk acoustic wave (BAW) devices and methods for fabricating bulk acoustic wave devices from the Group-III nitride material system. In general terms, the present invention is directed to fabricating (BAW) devices having an active region made from the Group-III nitride material system, and in particular where the active region is a Group-III nitride thin film epitaxial layer. In one embodiment of the present invention the epitaxial layer is grown on a growth substrate, and the substrate and its epitaxial layer is mounted to a support/carrier substrate, typically by flip-chip mounting. The substrate is then removed and the remainder of the device is processed to form the BAW device.

The present invention is particularly applicable to methods and devices using a carrier substrate made of a material that is less expensive and easier to process compared to typical Group-III nitride growth substrates. For example, the carrier substrate can be made of silicon (Si) which is less expensive and easier to process compared to silicon carbide (SiC), a Group-III nitride growth substrate, making fabrication of the entire device easier and less expensive.

BAW devices having Group-III nitride active regions can be used for high frequency acoustic devices and exhibit superior characteristics including but not limited to excellent piezoelectric and acoustic properties. These properties provide acoustic velocities in Group-III nitride materials making them particularly applicable to high frequency devices. Group-III nitride materials are also thermally and chemically stable such that BAW devices made of these materials can be used in harsh environments. Group-III nitrides also have superior electronic, optoelectronic properties, making possible devices based on acoustic electro-optical effects. The BAW device can also provide the further advantage of reduced contamination of the active region surfaces that are covered by the BAW device electrodes. Electrode spacing between acoustic devices determines the frequency of operation. With surface acoustic devices (SAW), the electrode spacing is limited by current lithography techniques. While for BAW devices, the thickness of the active layer determines the frequency of operation. Thus, thin film epitaxial growth allows for electrode spacing closer than is allowed by current lithography techniques.

BAW devices according to the present invention can be used in many different applications including, but not limited to: high frequency resonators, filters, transducers in microwave and modern communication systems; chemical and gas detection systems; specific custom broad band devices with varying membrane thickness; acoustic electro-optic devices for applications such as use of acoustic waves to diffract beams of light similar to a diffraction grating; and bio sensing applications.

The present invention is described herein with reference to certain embodiments but it is understood that the invention can be embodied in many different forms and should not be construed as limited to the embodiments set forth herein. It is also understood that when an element such as a layer, region or substrate is referred to as being "on" another element, it can be directly on the other element or intervening elements may also be present. Furthermore, relative terms such as "inner", "outer", "upper", "above", "lower", "beneath", "below" and "overlies", and similar terms, may be used herein to describe a relationship of one layer or another region. It is understood that these terms are intended to encompass different orientations of the device in addition to the orientation depicted in the figures.

Although the terms first, second, left, right, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, for example, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 1 through 5 show one embodiment of a BAW device 10 according to the present invention at different steps in one fabrication method according to the present invention. Although the BAW device 10 is shown as a single device, it is understood that typical fabrication processes occur at the wafer level with the devices being separated using known separation processes following wafer level processing. The BAW device 10 is shown herein as a single device to simplify the description herein, but it is understood that the invention herein is not limited to single device fabrication.

Referring first to FIG. 1, the BAW device 10 comprises a growth substrate 12, that can be made of many different materials. In one embodiment according to the present invention the growth substrate 12 can be semi-insulating silicon carbide (SiC) such as, for example, a 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Appropriate SiC substrates are manufactured by, for example, Cree, Inc., of Durham, N.C., the assignee of the present invention, and methods for producing such materials are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize other suitable substrate materials. These materials include sapphire, aluminum nitride, aluminum gallium nitride, gallium nitride, silicon, GaAs, ZnO, InP and the like, or any other material or combination of materials capable of supporting growth of a Group-III nitride material.

An epitaxial layer 14 is grown on the substrate 12 that will serve as the active region for the device 10. The layer 14 can be fabricated using known methods such as growth in metalorganic chemical vapor deposition (MOCVD) reactor using known source gasses and typical temperature ranges. The epitaxial layer can be made from many different material systems with the preferred being the Group-III nitride material system, and the layer 14 being single crystal Group-III nitride.

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. As well understood by those in this art, the Group III elements can combine with nitrogen to form binary (e.g., GaN), ternary (e.g., AlGaN and AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$, where $0 \leq x \leq 1$, are often used to describe them.

Figure 10:
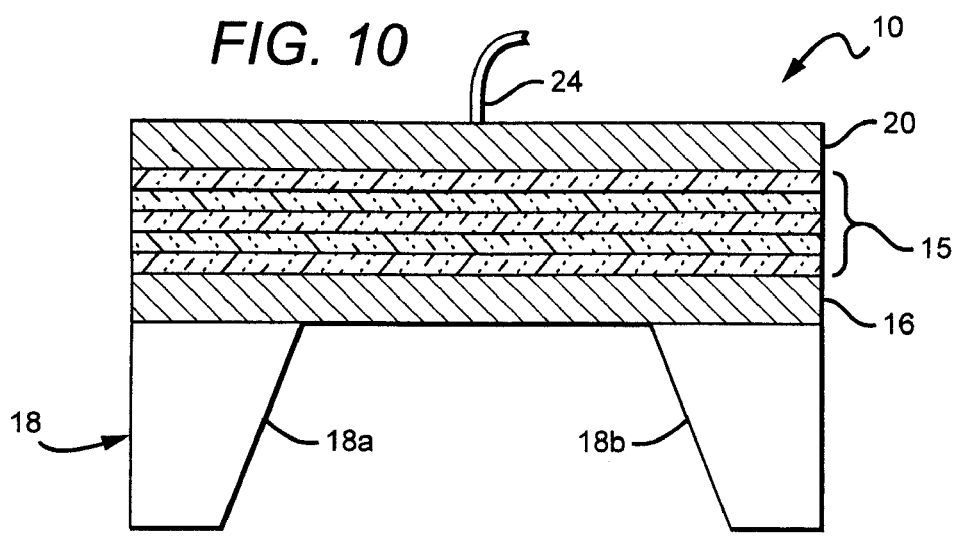

The epitaxial layer 14 can have different thicknesses depending on the desired frequency of operation, with thinner layers being used for higher frequency operation. In one embodiment according to the present invention the epitaxial layer has a thickness in the range of approximately 0.01 to 0.4 microns. A preferred thickness is in the range of approximately 0.1 to 0.2 microns. It is understood that in other embodiments, such as the embodiment shown in FIG. 10, the epitaxial layer can also comprise more than one layer 15 of Group-III nitride material with the different layers having different compositions.

Following growth of the epitaxial layer 14, a first metal electrode 16 can be deposited on the epitaxial layer 14 using known methods such as sputtering. The first metal electrode 16 can comprise typical semiconductor metallization materials such as nickel, gold, platinum, aluminum (Ni/Au/Pt/Al) or combinations thereof. The first metal electrode 16 can also have many different thicknesses with a suitable range being approximately 100 angstroms to a few microns. It is understood that in other embodiments according to the present invention, the first electrode 16 can instead be deposited on the carrier wafer (shown in FIG. 2 and described below). The growth substrate 12 and epitaxial layer 14 combination can then be mounted to the carrier wafer, on the first electrode 16. The first metal electrode 16 is shown as a metal layer, but it is understood that the first metal electrode can be of various geometries such as interdigitated fingers.

Figure 2:
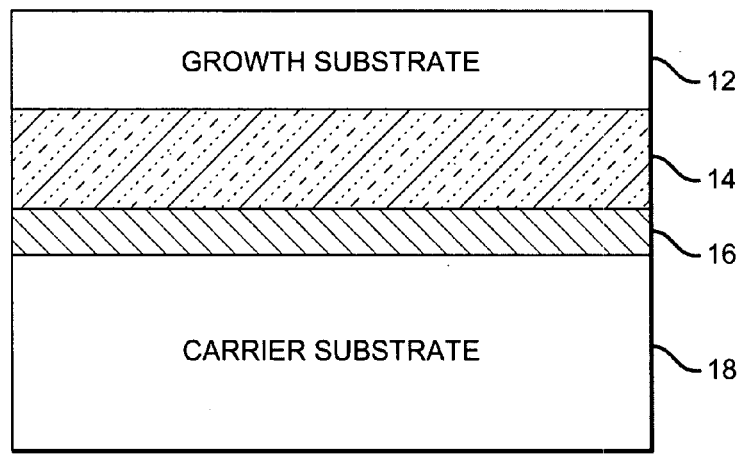
FIG. 2 is a sectional view of the BAW device in FIG. 1, wafer mounted on a carrier substrate.

Referring now to FIG. 2, the substrate 12, epitaxial layer 14 and first electrode 16 combination can be flip-chip mounted to a carrier substrate (wafer) 18. Many different mounting methods can be used, with a preferred method being wafer bonding accomplished using solder, epoxy, polyamides and polymers for direct bonding. The wafer bonding can also be accomplished using anodic bonding. The carrier wafer can comprise many different materials of different thicknesses selected to provide structural support. In some embodiments, the carrier substrate 18 can be electrically conductive and can also be used to integrate additional electronics. Some of the materials that can be used for the carrier substrate 18 include silicon (Si), germanium (Ge), zinc oxide (ZnO), silicon carbide (SiC) and glass. In one embodiment, the carrier substrate comprises a material such as Ge that has good thermal conductivity to allow heat to conduct away from the epitaxial layer 14 during operation.

Figure 3:
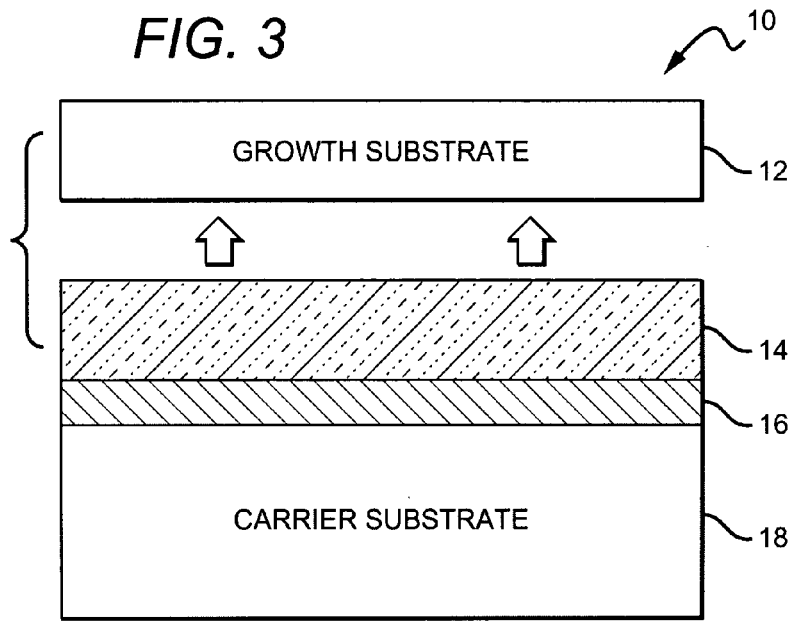
FIG. 3 is a sectional view of the BAW device in FIG. 2 with the growth substrate removed.

Referring now to FIG. 3, the growth substrate 12 is removed using removal processes such as grinding, laser ablation, and wet or dry etching. Removal of the substrate 12 leaves a single crystal Group-III nitride layer 14 bonded to the carrier substrate 18, with the first metal electrode 16 sandwiched between the epitaxial layer 14 and the carrier substrate 18. In some embodiments, the epitaxial layer 14 can also be thinned or further processed, such as by etching or grinding, after removal of the growth substrate 12. This can allow for additional control of the epitaxial layer 14 thickness.

Referring now to FIG. 4, a second metal electrode 20 can be deposited on the exposed surface of the epitaxial layer 14 with the epitaxial layer 14 sandwiched between the first and second electrodes 16, 20. Similar to the first metal electrode 16, the second metal electrode 20 can be deposited using known semiconductor metallization techniques and can comprise typical semiconductor metallization materials such as nickel, gold, platinum, aluminum (Ni/Au/Pt/Al) or combinations thereof, and can also comprise an IDT. The second metal electrode 20 can also have many different thicknesses, with a suitable range of thicknesses being 100 angstroms to a few microns. For embodiments having an electrically conductive carrier substrate 18 electrical contact can be made to the device 10 at the carrier substrate 18 and second metal electrode 20. In one embodiment the second metal electrode 20 can be contacted by a wire bond while the carrier substrate 18 can be contacted directly to the devices mounted surface, such as a printed circuit board (PCB).

In other embodiments, the backside of the device 10, and in particular the carrier substrate 18, can be further processed as desired. Referring to FIG. 5, the carrier substrate 18 can be processed using different etch techniques wet etching, plasma etching or laser micromachining to remove a section of the carrier substrate 18 to the first metal electrode 16, resulting in first and second carrier substrate portions 18a, 18b. This allows for different contacting arrangements to the first and second metal electrodes 16, 20. As shown in FIG. 5, the carrier substrate 18 can be made of an electrically conductive material so that an electrical signal can be applied to the first metal electrode 16, through either of the carrier substrate portions 18a, 18b. For example, the first carrier substrate 18a can have a contact 22 at its bottom surface, or in other locations and an electrical signal applied to the contact 22 would be conducted to the first electrode 16. The second electrode 20 can be contacted in many different ways, such as by a wire bond 24.

FIG. 6 shows another embodiment of a BAW device 40 according to the present invention having many of the same or similar features as the BAW device shown in FIG. 5. For those same or similar features in FIG. 6, as well as the figures below, the same reference numerals are used with the understanding that the description of the features above applies to BAW device 40 herein.

The BAW device 40 comprises an epitaxial layer 14, first electrode 16 and second electrode 20. The BAW device 40, however, has a carrier substrate 42. In this embodiment, the carrier substrate 42 and its first and second portions 42a, 42b can be electrically insulating or do not efficiently conduct electricity. As a result, an electrical signal cannot be applied to first electrode 16 through the carrier substrate portions 42a, 42b. The BAW device 40 is provided with a conductive layer 44 that can run from the bottom surface of one or both portions 42a, 42b, and in this case runs from the bottom surface of the first portion 42a. The conductive layer 44 continues to the first electrode 16 so that an electrical signal applied to the conductive layer 44 is conducted to the second electrode 20.

The conductive layer 44 can also comprise typical semiconductor metallization materials applied using known processes as described above, and can comprise a continuous layer or a plurality of conductive paths. The second electrode 20 can be contacted using different arrangements, such as a wire bond 24. It is understood that although this conductive layer in this embodiment is shown as being used with carrier substrates that are electrically insulating or do not efficiently conduct electricity, this arrangement can be used with embodiments having an electrically conductive carrier substrate.

Figure 7:
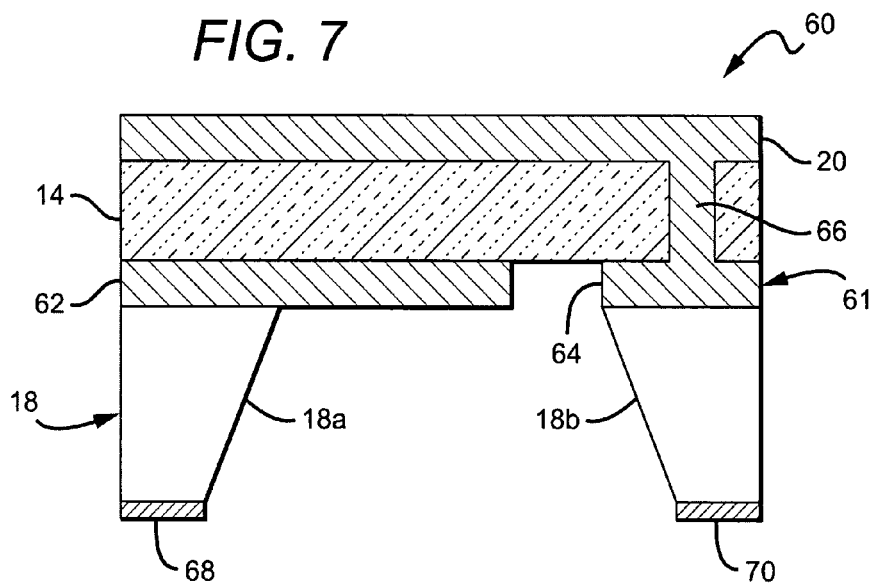
FIGS. 7 and 10 illustrate other embodiments of a BAW device according to the present invention after backside processing.

FIG. 7 shows still another embodiment of a BAW device 60 according to the present invention having an epitaxial layer 14, second electrode 20, and carrier substrate 18. A first electrode 61 is also included, but in this embodiment it is divided into separate left and right first electrode portions 62, 64. A conductive via 66 is also included through the epitaxial layer 14 providing an electrically conductive path between the electrode portion 64 and the second electrode 20. The first electrode can be etched into the separation portions 62, 64 following processing of the carrier substrate 12, and the conductive vias 66 can be formed through the epitaxial layer 14 through etching of a pathway through the epitaxial layer 14 and then filling of the pathway during deposition of the first or second electrodes. It is understood that these features can also be formed using other known processes.

The BAW device 60 can also comprise first and second contacts 68, 70 each of which is at the bottom of a respective one of the portion of the carrier substrate 18. In this embodiment, the carrier substrate 18 can efficiently conduct electricity, and an electrical signal applied across the contacts 68, 70 is conducted to the epitaxial layer 14. The electrical signal applied to the first contact 68 is conducted through the carrier substrate first portion 18a, to the first electrode left portion 62, and to the epitaxial layer 14. The electrical signal applied to the second contact 70 is conducted through the carrier substrate second portion 18b, through the second electrode right portion 64, through the conductive vias 66 and to the first electrode 20. This arrangement allows for contacting the BAW device without wire bonding and is particularly applicable to surface mount applications. It is understood that the BAW device 60 can also be used with conductive layer and wire bond arrangements as well.

Figure 8:
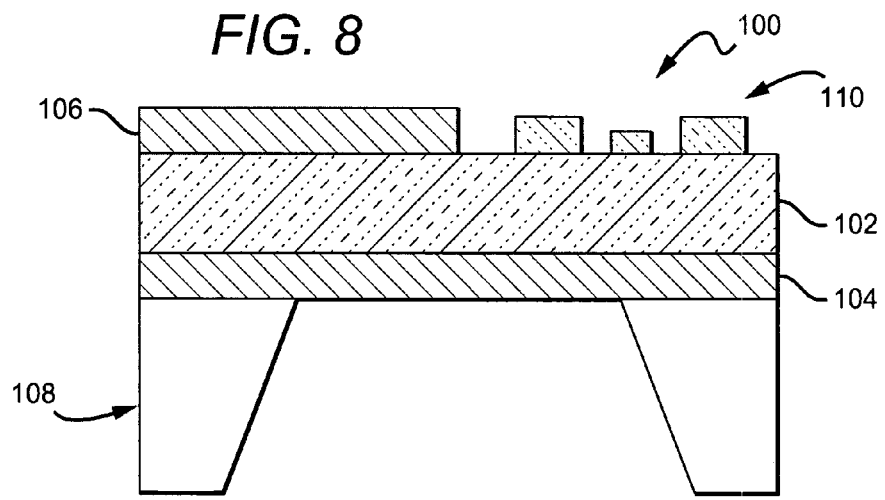
FIG. 8 is a sectional view of one embodiment of a BAW device according to the present invention having integral components and devices.
Figure 9:
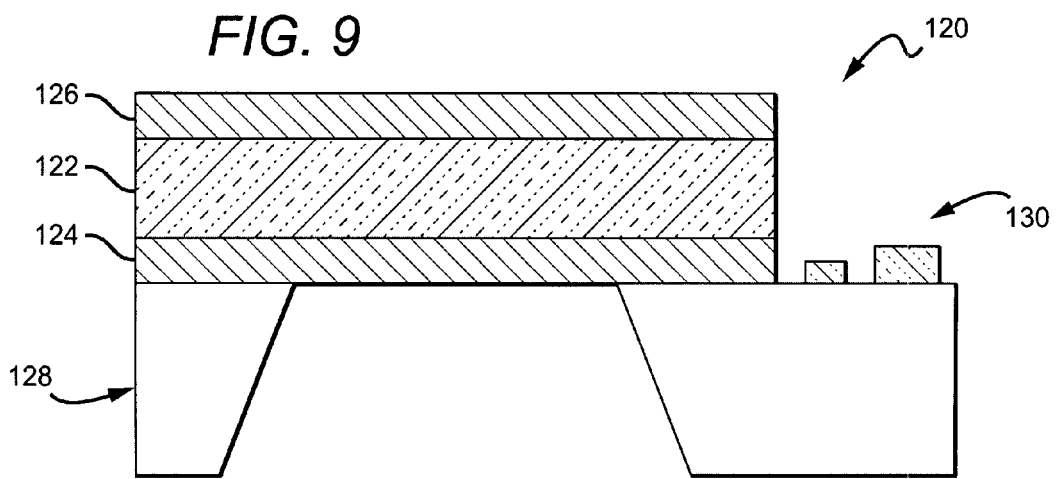
FIG. 9 is a sectional view of another embodiment of a BAW device according to the present invention having integral components and devices.

The BAW devices can be formed with other electronic elements or devices in different locations to operate in conjunction with the BAW device. FIG. 8 shows another embodiment of a BAW device 100 having an epitaxial layer 102, first electrode 104, second electrode 106, and carrier substrate 108. The BAW device 100 further comprises integrated devices 110 to the epitaxial layer that can comprise many different devices including but not limited to light emitting diodes (LEDs), laser diodes, detectors, sensors, field effect transistors (FETs), high electron mobility transistors (HEMTs), etc. The devices 110 can be interconnected in many different ways such as by conductive traces, and the devices 110 can be formed in the epitaxial layer during growth of the epitaxial layer, or can be formed on the epitaxial layer following removal of the substrate. FIG. 9 shows another embodiment of a BAW device 120 having an epitaxial layer 122, first electrode 124, second electrode 126, and carrier substrate 128, with similar integrated devices 130 formed integral to the carrier substrate 128. In still other embodiments, the epitaxial layer 102 or carrier substrate can comprise other integral advanced features such as acoustic reflectors.

The approach discussed above is one of several approaches to realize Group-III nitride BAW devices. Many different methods can be used such as providing a sacrificial layer between the growth substrate and epitaxial layer that can be removed by processes such as etching to release the substrate from the epitaxial layer. Although the present invention has been described in detail with reference to certain preferred configurations thereof, other versions are possible. Therefore, the spirit and scope of the invention should not be limited to the versions described above.

I claim:

1. A bulk acoustic wave (BAW) device, comprising:
   first and second metal electrodes;
   a carrier substrate; and
   a Group-III nitride epitaxial layer electrically coupled to said first and second electrodes, wherein said first electrode comprises at least two distinct portions with each of said portions between said carrier substrate and said epitaxial layer, said Group-III nitride epitaxial layer not more than approximately 0.4 microns thick.

2. The device of claim 1, further comprising electrical contacts to said first and second metal electrodes.

3. The device of claim 1 wherein said epitaxial layer comprises a Group-III nitride material having a thickness in the range of 0.1 to 0.2 microns.

4. The device of claim 1 wherein said epitaxial layer has different thicknesses.

5. The device of claim 1, wherein said first and second electrodes and said epitaxial layer are on said carrier substrate.

6. The device of claim 5, wherein said carrier substrate comprises first and second portions, the surface of at least one of said portions of said first metal electrode exposed adjacent to one of said carrier substrate portions.

7. The device of claim 6, wherein electrical contact is made to said first metal electrode through said carrier substrate.

8. The device of claim 6, further comprising a conductive layer from one of said portions of said carrier substrate to said first electrode.

9. The device of claim 6, wherein said at least two distinct portions of said first electrode are between a respective one of the carrier substrate portions and said epitaxial layer.

10. The device of claim 9, further comprising at least one conductive via disposed to electrically connect said first electrode right portion and said second electrode.

11. The device of claim 10, wherein electrical contact is made to said first electrode through said first portion of said carrier substrate, and electrical contact is made to said second electrode through said second portion of said carrier layer, said first electrode right portion and said conductive path.

12. The device of claim 5, further comprising electronic devices integral to said epitaxial layer or said carrier substrate.

13. The device of claim 5, wherein said carrier substrate comprises a material from the group consisting of silicon, germanium, zinc oxide, silicon carbide and glass.

14. A bulk acoustic wave (BAW) device, comprising:
   first and second electrodes, said first electrode comprising at least two electrically isolated portions, said second electrode electrically connected to one of said at least two portions with a via;
   a Group-III nitride layer electrically coupled to said first and second electrodes, wherein said Group-III nitride layer is not more than approximately 0.4 microns thick; and
   a substrate, said first electrode adjacent to said substrate;
   wherein said first and second electrodes are electrically connected to different portions of a surface of said substrate opposite said Group-III nitride layer.

15. The device of claim 14, further comprising electrical contacts to said first and second electrodes.

16. The device of claim 14, said Group-III nitride layer having a thickness in the range of 0.1 to 0.2 microns.

17. The device of claim 14 wherein, said Group-III nitride layer has different thicknesses.

18. The device of claim 14 wherein said substrate comprises first and second portions, the surface of said first electrode exposed adjacent to one of said substrate portions.

19. The device of claim 18, wherein electrical contact is made to said first electrode through said substrate.

20. The device of claim 18, further comprising a conductive layer from one of said portions of said substrate to said first electrode.

21. The device of claim 18, wherein said first electrode is separated into first and second portions, with each of said first and second electrode portions between a respective one of the substrate portions and said Group-III nitride layer.

22. The device of claim 21, said via disposed to electrically connect said first electrode second portion and said second electrode.

23. The device of claim 22, wherein electrical contact is made to said first electrode through said first portion of said substrate, and wherein electrical contact is made to said second electrode through said second portion of said substrate, said first electrode second portion, and said conductive path.

24. The device of claim 14, further comprising electronic devices integral to said Group-III nitride layer or said substrate.

25. The device of claim 14, wherein said substrate comprises a material from the group consisting of silicon, germanium, zinc oxide, silicon carbide and glass.

26. A bulk acoustic wave (BAW) device, comprising:
first and second metal electrodes, said first electrode comprising at least two electrically isolated portions, said second electrode electrically connected to one of said portions with a via;
a plurality of Group-III nitride epitaxial layers electrically coupled to said first and second electrodes, wherein said plurality of Group-III nitride epitaxial layers is not more than approximately 0.4 microns thick; and
a carrier substrate, said first and second electrodes and said plurality of epitaxial layers on said carrier substrate.

27. The device of claim 26, further comprising electrical contacts to said first and second metal electrodes.

28. The device of claim 26, each of said plurality of layers having a different thickness.

29. The device of claim 26 wherein said carrier substrate comprises first and second portions, the surface of said first metal electrode exposed adjacent to one of said carrier substrate portions.

30. The device of claim 29, further comprising a conductive layer from one of said portions of said carrier substrate to said first electrode.

31. The device of claim 29, wherein said at least two electrically isolated portions are between a respective one of the carrier substrate portions and said epitaxial layer.

32. The device of claim 31, wherein electrical contact is made to said first electrode through said first portion of said carrier substrate, and electrical contact is made to said second electrode through said second portion of said carrier layer, said first electrode right portion and said conductive path.

33. The device of claim 26, wherein electrical contact is made to said first metal electrode through said carrier substrate.

34. The device of claim 26, further comprising electronic devices integral to said epitaxial layer or said carrier substrate.

35. The device of claim 26, further comprising electronic devices which are integral to said carrier substrate.

36. The device of claim 26, wherein said carrier substrate comprises a material from the group consisting of silicon, germanium, zinc oxide, silicon carbide and glass.

37. The device of claim 26, said epitaxial layers having different material compositions.

38. The device of claim 14, further comprising electronic devices which are integral to said carrier substrate.

39. The device of claim 5, further comprising electronic devices which are integral to said carrier substrate.

* * * * *